United States Patent [19]
Aihara

[11] Patent Number: 5,214,393
[45] Date of Patent: May 25, 1993

[54] TRANSMISSION OUTPUT CONTROL CIRCUIT

[75] Inventor: Yukichi Aihara, Kawasaki, Japan

[73] Assignee: Matsushita Electric Industrial Co., Ltd., Osaka, Japan

[21] Appl. No.: 740,966

[22] Filed: Aug. 6, 1991

[30] Foreign Application Priority Data

Aug. 20, 1990 [JP] Japan ................... 2-219215
Aug. 20, 1990 [JP] Japan ................... 2-219216
Aug. 20, 1990 [JP] Japan ................... 2-219217

[51] Int. Cl.⁵ .............................. H03G 3/20
[52] U.S. Cl. ........................ 330/279; 330/129; 455/116; 455/126
[58] Field of Search ............. 330/127–129, 330/279; 375/98; 455/116, 126, 127, 234, 239, 240

[56] References Cited

U.S. PATENT DOCUMENTS

| | | | |
|---|---|---|---|
| 4,392,245 | 7/1983 | Mitama | 455/115 |
| 4,476,437 | 10/1984 | Fujiwara | 330/279 X |
| 4,523,155 | 6/1985 | Walczak et al. | 330/279 |
| 4,602,218 | 7/1986 | Vilmur et al. | 330/129 X |
| 5,126,686 | 6/1992 | Tam | 330/279 X |

FOREIGN PATENT DOCUMENTS 0135154 3/1985 European Pat. Off.
0261967 3/1988 European Pat. Off.

Primary Examiner—James B. Mullins
Attorney, Agent, or Firm—Stevens, Davis, Miller & Mosher

[57] ABSTRACT

In a radio transmitter, a part of an output of a transmission output amplifying circuit is supplied to a variable attenuating circuit and an output of the variable attenuating circuit is supplied to a detecting circuit. An output of the detecting circuit and a reference voltage are compared and a control voltage is given to the transmission power amplifying circuit in accordance with the result of the comparison, thereby controlling the transmission output. By controlling the attenuation amount of the variable attenuating circuit, the transmission output can be controlled over a wide dynamic range with a high reproducing fidelity.

12 Claims, 4 Drawing Sheets

TRANSMISSION OUTPUT CONTROL CIRCUIT

BACKGROUND OF THE INVENTION

The present invention mainly relates to a radio transmitter of the TDMA (Time Division Multiple Access) system and, more particularly, to a transmission output control circuit for controlling an output level of a burst-shaped transmission wave and leading and trailing characteristics of an output for a wide dynamic range.

Hitherto, what is called an automatic power control (APC) circuit as shown in FIG. 1 has been known as such a kind of transmission output control circuit. Such an APC circuit functions so as to keep a transmission output constant for fluctuations of various conditions such as power supply voltage, input, temperature, and the like. In FIG. 1, reference numeral 1 denotes a transmission VCO (Voltage Controlled Oscillator); 2 a transmission power amplifying circuit; 3 a directional coupler; 4 a detecting circuit using a diode; and 5 a comparison error amplifier. An output from the transmission VCO 1 is power amplified by the transmission power amplifying circuit 2 and is transmitted through the directional coupler 3. The directional coupler 3 branches a part of the output of the amplifying circuit 2 and supplies it to the detecting circuit 4. A detection output of the detecting circuit 4 is supplied to the comparison error amplifier 5. The amplifier 5 compares the received detection output and a reference waveform 8 ($V_{ref}$) and gives a control voltage $V_{APC}$ to the amplifying circuit 2 in accordance with the result of the comparison, thereby controlling an amplification factor. A transmission output control negative feedback loop is constructed as mentioned above. A transmission output level ordinarily has a discrete value. A difference between the maximum and minimum levels is up to 20 dB or slightly higher. Therefore, an object of such a loop can be substantially accomplished by a simple detecting circuit using a diode which has generally been well known.

In the narrow band TDMA radio communication which will generally be wide-spread in the future, however, since a transmission wave has a burst-like shape, the leading and trailing characteristics of the transmission wave must be accurately controlled in order to suppress a spread of the spectrum to an adjacent channel.

For instance, in the GSM standard as a Pan European integrated standard of the digital cellular telephone, the leading and trailing response time characteristics are set by specifying an output lower limit of −36 dBm or a point of a level relative ratio of −70 dBC to a peak value and a point of −30 dBC and a time which is required to reach the peak value.

However, since the detecting characteristics of the diode are applied to the general detecting circuit as mentioned above, the dynamic range is naturally narrow and the dynamic range is set to merely up to 20 at most and a few dB and it is considerably short of controllable transmission output ranges necessary for practical applications.

SUMMARY OF THE INVENTION

It is an object of the invention to solve the above conventional problems and to supplement the short of the dynamic range of a detecting circuit and to controllably produce a transmission output for a satisfactory wide dynamic range with a high reproduction fidelity.

To accomplish the above object, according to one aspect of this invention, a transmission output control circuit for a TDMA radio transmitter comprises: a directional coupler to separate a part of an output of a transmission power amplifying circuit; a variable attenuator to attenuate a separated output; a detecting circuit to detect an output of the variable attenuator; and means for controlling an amplification factor of the transmission power amplifying circuit in accordance with the result of the comparison between an output of the detecting circuit and a reference value.

According to another aspect of this invention, a transmission output control circuit for a TDMA radio transmitter comprises: a directional coupler to separate a part of an output of a transmission power amplifying circuit; a non-linear amplifier to non-linearly amplify a separated output; a detecting circuit to detect an output of the non-linear amplifier; and means for controlling an amplification factor of the transmission power amplifying circuit in accordance with the result of the comparison between an output of the detecting circuit and a reference value.

According to a further aspect of this invention, a transmission output control circuit for a TDMA radio transmitter comprises: a directional coupler to separate a part of an output of a transmission power amplifying circuit; a variable attenuator to attenuate a separated output; a non-linear amplifier to amplify an output of the variable attenuator in dependence upon logarithmic function; a detecting circuit to detect an output of the non-linear amplifier; and means for controlling an amplification factor of the transmission power amplifying circuit in accordance with the result of the comparison between an output of the detecting circuit and a reference value.

According to the above-mentioned aspect of the invention, a part of the transmission output generated from the transmission power amplifying circuit is taken out by the directional coupler and passes through the variable attenuator and is detected by the detecting circuit. When an attenuation amount of the variable attenuator increases, the detected value decreases and the transmission output appears to decrease, whereby a control is made to increase the transmission output by the negative feedback loop. Accordingly, the transmission output can be controlled for an extended wide dynamic range with a high reproduction fidelity by the combination with the control by the variable attenuator without relying on an increase in the dynamic range of the detecting circuit.

According to the second-mentioned aspect of the invention, a part of the transmission output generated from the transmission power amplifying circuit is extracted by the directional coupler and is amplified by the non-linear amplifier in dependence upon a logarithmic function and is detected by the detecting circuit, so that the detection output which has been almost linearly corrected is derived. Consequently, the dynamic range of the detecting circuit is equivalently enlarged and the amplification factor of the transmission power amplifying circuit is controlled on the basis of the detection output.

A part of the transmission output generated from the transmission power amplifying circuit is extracted by the directional coupler and passes through the variable attenuator and also passes through the non-linear amplifier and is detected by the detecting circuit. When the attenuation amount increases, the detection value decreases and the transmission output appears to decrease, whereby a control is made to increase the transmission output by the negative feedback loop. On the other hand, the non-linear amplifier operates to enlarge the dynamic range of the detecting characteristics.

According to the invention, therefore, the transmission burst output can be relatively easily controlled for a wide dynamic range with a high precision by controlling in combination with the variable attenuator without relying on only the extension in the dynamic range of the detecting circuit.

DESCRIPTION OF THE PREFERRED EMBODIMENTS

Figure 1:
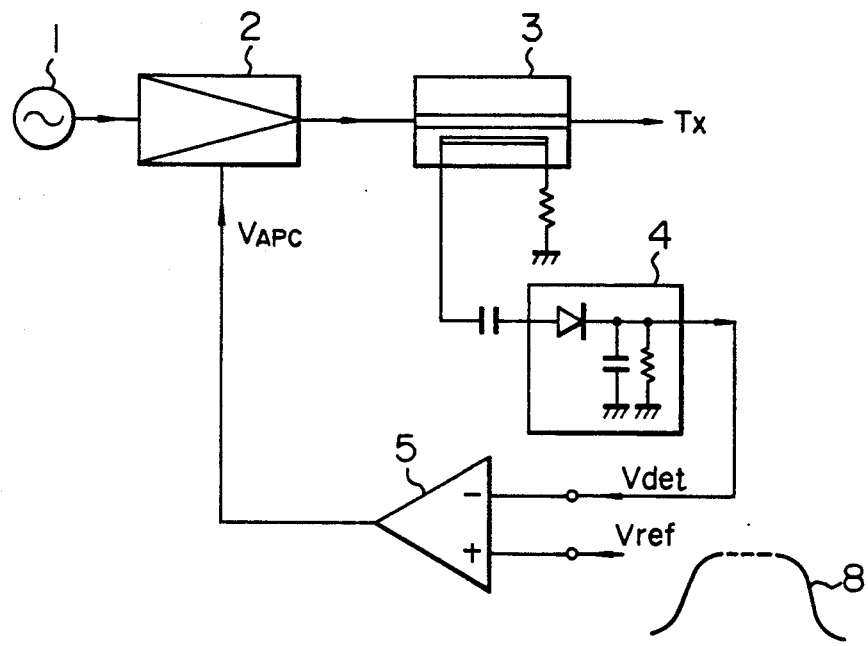
FIG. 1 is a block diagram of a conventional transmission output control circuit.
Figure 2:
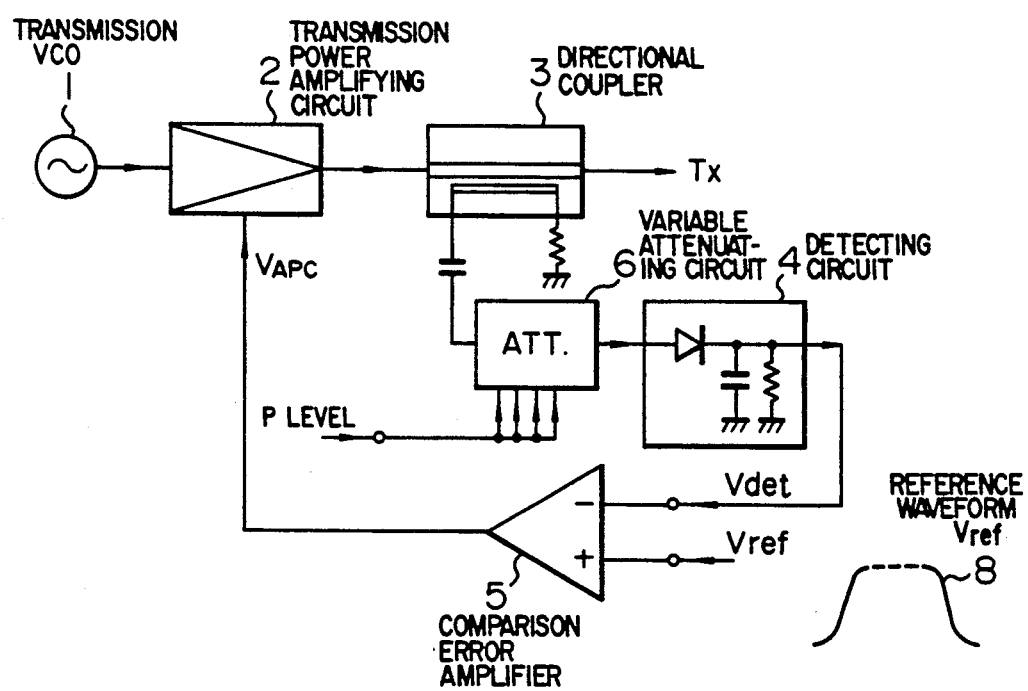
FIG. 2 is a block diagram of the first embodiment of the invention.

FIG. 2 is a diagram showing the first embodiment of the invention. In FIG. 2, reference numeral 1 denotes the transmission VCO; 2 the transmission power amplifying circuit; 3 the directional coupler to extract a part of a transmission power; 4 the detecting circuit using a diode; and 5 the comparison error amplifier as a differential amplifier. When the reference voltage $V_{ref}$ is supplied to a (+) terminal of the amplifier 5, an output signal $V_{APC}$ is set to the high level, thereby amplifying the transmission power. Therefore, a signal $V_{det}$ which is an output of the detecting circuit 4 and is supplied to a (−) terminal of the amplifier 5 increases. If $V_{det} > V_{ref}$, the output $V_{APC}$ decreases, thereby reducing the transmission output. That is, in the comparison error amplifier 5, $V_{APC}$ is changed so that $V_{det} = V_{ref}$. Reference numeral 6 denotes a variable attenuating circuit for attenuating the transmission output extracted by the directional coupler 3 and for supplying an attenuated output to the detecting circuit 4. A control line is connected to the variable attenuating circuit 6, so that an arbitrary attenuation amount can be instantaneously derived. A switching control of an output level is mainly executed on the control line of the variable attenuating circuit 6.

Figure 3:
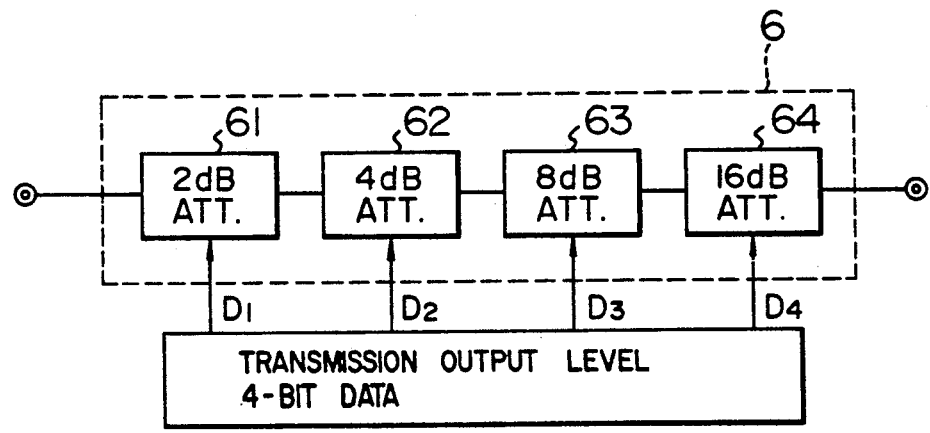
FIG. 3 is a block diagram of a variable attenuating circuit in the first and third embodiments.

When explaining with respect to the foregoing GSM standard as an example, the transmission output ranges from 43 dBm to 13 dBm, which is divided into 16 steps with a span or difference of 2 dB therebetween. A time mask of a burst waveform is specified by a relative value and the dynamic power control for 30 dB or more is needed. In the case of the minimum output level, the control is executed from the level of −17 dBm or less, so that a control range is needed to cover a wide range of 60 dB. The dynamic range which is necessary for the control of the vurst waveform is shared and provided by the detecting circuit and the control of the transmission power level of a high precision of a 2 dB step is shared and provided by the variable attenuator. As one implementation for realizing such a requirement for the dynamic range of the variable attenuator, attenuators of $2^N$ dB (N=1, 2, 3, 4) may be cascade connected. This is because if the data of the transmission output level is 4-bit parallel data, they can be directly taken by the control line, so that such a construction is simple with a high precision. FIG. 3 shows an example of such a construction. The variable attenuating circuit 6 comprises a 2 dB attenuating section 61, a 4 dB attenuating section 62, an 8 dB attenuating section 63, and a 16 dB attenuating section 64. Thus the attenuation amount can be controlled to produce 16 attenuation variables stepped with an increment of 2 dB from 0 dB to 30 dB by transmission output level 4-bit data $D_1$, $D_2$, $D_3$, and $D_4$. Although one control line may be used by depending upon analog control or the attenuation amount may be controlled by a single attenuator through a D/A converter, it is necessary to secure a precision for the control of attenuation amount.

The first embodiment enables the TDMA transmission output to be controlled by the construction as mentioned above. Explaining this in more detail, the output control of the dynamic range of 70 dB mentioned above is divided into the control of the burst waveform and the control of the output level. The control of the burst waveform is performed to prevent spread of the related frequency spectrum and such control is executed by fully using the dynamic range of the detecting circuit 4 from the lower limit to the upper limit. It is generally sufficient to use a detecting range from 30 to 40 dB. Therefore, the reference waveform 8 which is supplied to the comparison error amplifier 5 is fundamentally constant irrespective of the transmission power level.

Since the control of the transmission power level has been predetermined before the start of the transmission, an attenuation amount of the variable attenuating circuit 6 is set in accordance with the value of the transmission power level. That is, when the output is maximum, the attenuation amount is also maximum. To reduce the output, for instance, on a 2 dB unit basis (i.e., with every decrement of 2 dB), it is sufficient to also reduce the attenuation amount on a 2 dB unit basis (with every decrement of 2 dB). Namely, the change width of the variable attenuating circuit 6 coincides with the change width of the transmission output. Generally, since a variation of the attenuating characteristic can be more easily managed than a variation of the detecting characteristic, a precision of the output level rises. As a practical method of constructing the variable attenuating circuit, it is also possible to make a device to raise the precision by mixedly arranging or disposing linear amplifiers in order to improve the impedance characteristic and the isolation characteristic.

As mentioned above, according to the first embodiment, the control of the wide transmission output control is shared by the variable attenuator which can be digitally controlled and the diode detecting circuit of high reproducibility. Therefore, the output control having a high precision and an excellent reproducing fidelity can be accomplished as compared with the conventional transmission output control circuit which depends on only the dynamic range of the detecting circuit.

Figure 4:
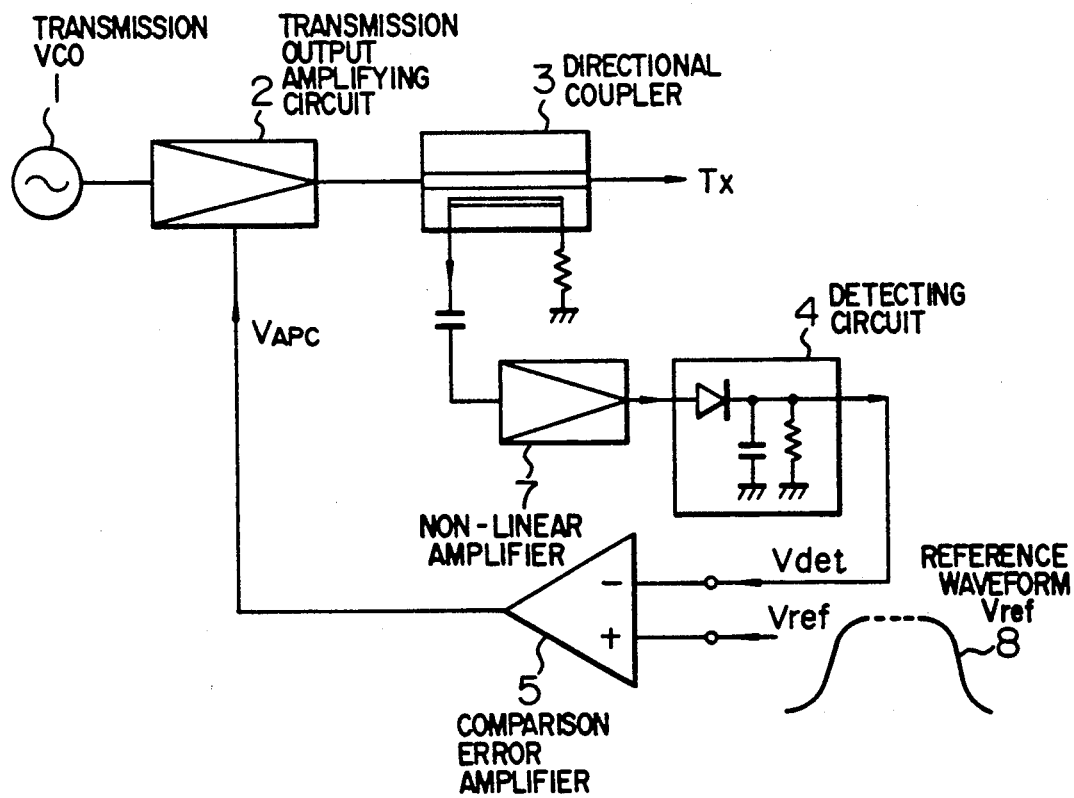
FIG. 4 is a block diagram of the second embodiment of the invention.
Figure 5:
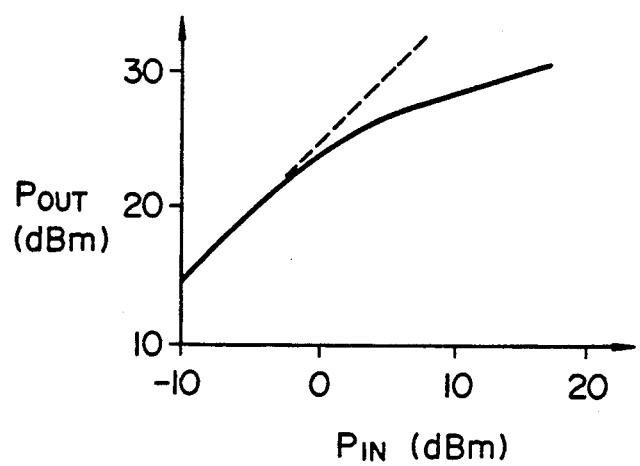
FIG. 5 is a diagram showing input and output characteristics of a non-linear amplifier in the second and third embodiments.
Figure 6:
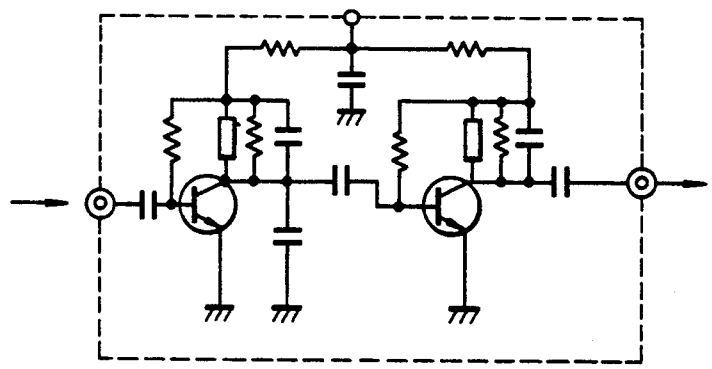
FIG. 6 is a circuit diagram showing an example of a non-linear amplifier.
Figure 7:
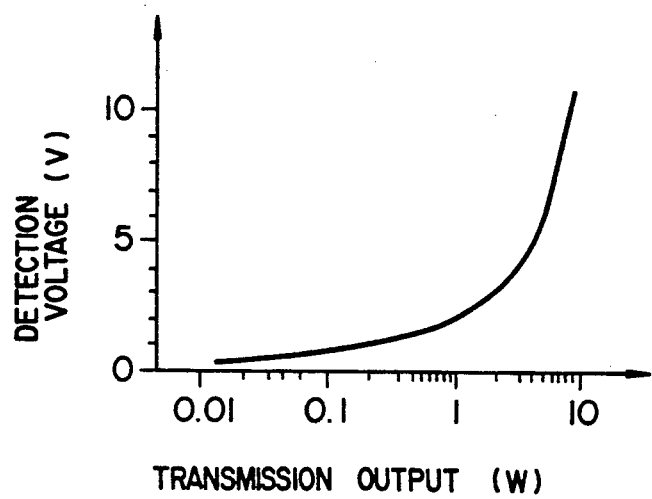
FIG. 7 is a diagram showing detecting characteristics of a detecting circuit in the first to third embodiments.

FIG. 4 is a diagram showing the second embodiment of the invention. In the diagram, the same parts and components as those in FIG. 2 are designated by the same reference numerals and their descriptions are omitted. Reference numeral 7 denotes a non-linear amplifier such as a RF frequency logarithm amplifier or a saturation type amplifier whose input and output characteristics are relatively similar to those of the logarithm amplifier. A part of the transmission power which has been amplified by the transmission power amplifying circuit 2 is extracted by the directional coupler 3 and is supplied to the non-linear amplifier 7. An amplifier whose amplifying characteristic changes in a logarithmic function manner as shown in FIG. 5 is used as a non-linear amplifier 7. The non-linear amplifier having such a characteristic can be realized by a saturation type amplifier by an RF amplifier using two transistors as shown in FIG. 6. An output of the non-linear amplifier 7 is supplied to the detecting circuit 4. If a diode detecting circuit is used as a detecting circuit 4, the detecting circuit has a detecting characteristic such that a detection voltage suddenly rises with an increase in input signal level as shown in FIG. 7. A synthetic characteristic with the characteristic of the non-linear amplifier 7, therefore, is as shown in a linear characteristic of FIG. 8.

The second embodiment intends to widen the dynamic range of the detecting circuit 4 by the construction as mentioned above. Explaining this in more detail, the detecting characteristic of the diode is as shown in FIG. 7 and the detected voltage suddenly rises with an increase in input signal level. A detecting sensitivity is also not constant and a control loop gain also decreases when the input signal level is small. To enlarge the dynamic range of the transmission power which can be controlled, therefore, it is necessary to extend the lower limit value and to suppress the leading of the upper limit and to set an inclination of the detecting characteristic to be as constant as possible.

Figure 8:
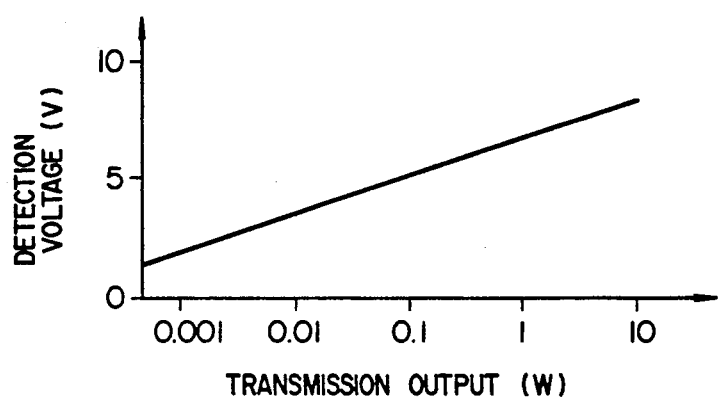
FIG. 8 is a diagram showing synthetic characteristics of the non-linear amplifier and the detecting circuit in the second embodiment.

Since the non-linear amplifier 7 has characteristics such that the gain decreases with an increase in input signal level as shown in FIG. 5, by arranging the non-linear amplifier 7 at a front stage of the detecting circuit 4, the dynamic range of the detecting characteristic can be enlarged as shown in FIG. 8. When presuming from the object of the invention, the invention is not limited to the amplifier having the strict logarithm converting characteristics. However, the above object is not accomplished by the linear amplifier. On the other hand, when a phase delay between the input and the output is large, such a case is improper to the high speed burst control as an object of the invention.

The waveform of the transmission burst wave can be controlled by using the fairly enlarged detecting characteristic and the transmission output changes at a high speed in accordance with the reference waveform 8 which is supplied to the comparison error amplifier 5.

By applying the transmission output control circuit according to the second embodiment to a transmission burst wave control circuit of a TDMA radio transmitter, large improvement effects were obtained with respect to both of the leading and trailing response times and the spectrum response of a frequency occupied band.

As described above, according to the second embodiment, by arranging the non-linear amplifier at the front stage of the detecting circuit, there are advantages such that the dynamic range of the transmission output detecting circuit can be fairly increased and the output control of the burst-shaped transmission wave can be performed.

Figure 9:
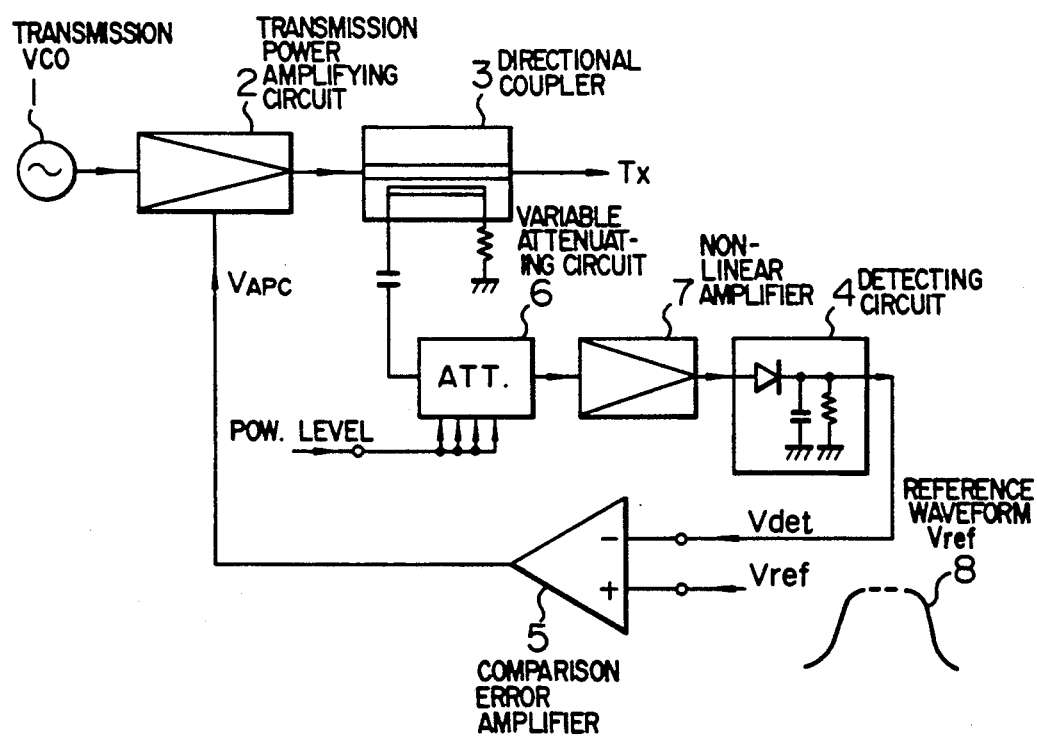
FIG. 9 is a block diagram of the third embodiment of the invention.

FIG. 9 is a diagram showing a construction of the third embodiment of the invention. In this diagram, the same parts and components as those shown in FIGS. 2 and 4 are designated by the same reference numerals and their descriptions are omitted here.

In this embodiment, to obtain a dynamic range which is necessary to control the burst waveform, a non-linear amplifier using a logarithm amplifier or a saturation type amplifier is arranged before the diode detecting circuit 4. FIG. 5 shows input and output characteristics of the third embodiment. It is sufficient to reduce the gain with an increase in input signal level and the invention is not particularly limited to the amplifier having the strict logarithm converting characteristics.

The control of the transmission level which requires a precision of a 2 dB step (i.e., 2 dB stepped control of the level) is executed by the variable attenuating circuit 6. As one implementation for satisfying such a requirement, attenuators of $2^N$ dB (N=1, 2, 3, 4) are cascade connected as shown in FIG. 3.

Since the variable attenuating circuit 6 and the non-linear amplifier 7 have been connected and arranged at the front stage of the diode detecting circuit 4 in the third embodiment, the wide transmission output control range has respectively been assigned to the variable attenuating circuit 6 which can be digitally controlled and the detecting circuit 4 in which the non-linear amplifier 7 such as a logarithm amplifier or a saturation type amplifier has been arranged at the front stage and the dynamic range of the detecting characteristic has been enlarged. Consequently, the control of the transmission burst wave which could not be performed by the conventional transmission output control circuit which depends on only the dynamic range of the diode detecting circuit can be realized at a high precision and a high reproducing fidelity.

The third embodiment enables the TDMA transmission output control to be performed by the construction as mentioned above. Explaining this in more detail, the output control of the dynamic range of 70 dB mentioned above is separated into the control of the burst waveform and the control of the output level. The control of the burst waveform is executed to prevent a spread of the frequency spectrum and ordinarily needs the dynamic range of the detection within a range from 30 to 40 dB. However, by using the detecting diode which is generally used, the dynamic range is set to about 20 dB. If the saturation type amplifier having the input and output characteristics as shown in FIG. 5 is inserted as a non-linear amplifier 7, the amplification gain is high at a low level and the detection lower limit is extended by only such a gain, while the gain gradually decreases at a high level, so that a sudden increase in detection voltage is suppressed and the detecting characteristics are as shown in FIG. 8. By using the detecting characteristics, the waveform of the transmission burst wave can be controlled and the reference input waveform 8 which is supplied to the comparison error amplifier becomes constant irrespective of the transmission power level as will be explained below.

Since a value of transmission power level has been predetermined before the start of the transmission, an attenuation amount of the variable attenuating circuit 6 is set in accordance with such a value for the control of the transmission power level. That is, the attenuation amount is also maximum when the output is maximum. To decrease the output, for example, on a 2 dB step unit basis, it is sufficient to also reduce the attenuation amount on a 2 dB unit basis. The change amount of the attenuation amount coincides with the change amount of the transmission output. Generally, upon manufacturing, since a variation in attenuating characteristic can be more easily managed than a variation in detecting characteristic from a quality standpoint, the setting precision of the output level rises.

As a practical method of constructing the variable attenuating circuit, the invention is not limited to the construction using only the attenuators but can also use a construction in which linear amplifying circuits are mixedly arranged, thereby improving the impedance and isolation characteristics and raising the precision.

I claim:

1. A transmission output control circuit comprising:
   a transmission power amplifying circuit for amplifying a transmission power;
   a directional coupler for separating a part of an output of the transmission power amplifying circuit;
   a serial circuit of a variable attenuating circuit and a non-linear amplifier, said serial circuit receiving an output separated by said directional coupler;
   a detecting circuit which receives an output of the serial circuit; and
   control means for controlling an amplification factor of the transmission power amplifying circuit in accordance with a result of a comparison between an output of the detecting circuit and a reference value.

2. A transmission output control circuit according to claim 1, having a variable attenuating circuit for enabling an attenuation amount to be changed on a 2 dB step unit basis.

3. A transmission output control circuit according to claim 1, wherein the non-linear amplifier has a characteristic such that a gain decreases with an increase in input.

4. A transmission output control circuit according to claim 1, wherein the non-linear amplifier has a logarithm converting characteristic.

5. A transmission output control circuit comprising:
   a transmission power amplifying circuit for amplifying a transmission power;
   a variable attenuator for attenuating a part of an output of the transmission power amplifying circuit;
   a non-linear amplifier which receives an output of the variable attenuator;
   a detecting circuit which receives an output of the non-linear amplifier; and
   control means for controlling an amplification factor of the transmission power amplifying circuit in accordance with a result of a comparison between an output of the detecting circuit and a reference value.

6. A transmission output control circuit according to claim 5, having a variable attenuating circuit for enabling an attenuation amount to be changed on a 2 dB step unit basis.

7. A transmission output control circuit according to claim 5, wherein the non-linear amplifier has a characteristic such that a gain decreases with an increase in input.

8. A transmission output control circuit according to claim 5, wherein the non-linear amplifier has a logarithm converting characteristic.

9. A transmission output control circuit comprising:
   a transmission power amplifying circuit for amplifying a transmission power;
   a serial circuit of a variable attenuator and a non-linear amplifier to which a part of an output of the transmission power amplifying circuit is supplied;
   a detecting circuit which receives an output of the serial circuit; and
   control means for controlling an amplification factor of the transmission power amplifying circuit in accordance with a result of a comparison between an output of the detecting circuit and a reference value.

10. A transmission output control circuit according to claim 9, having a variable attenuating circuit for enabling an attenuation amount to be changed on a 2 dB step unit basis.

11. A transmission output control circuit according to claim 9, wherein the non-linear amplifier has a characteristic such that a gain decreases with an increase in input.

12. A transmission output control circuit according to claim 9, wherein the non-linear amplifier has a logarithm converting characteristic.

* * * * *